(12) United States Patent
Talbot

(10) Patent No.: US 7,221,192 B1
(45) Date of Patent: May 22, 2007

(54) VOLTAGE ACCESS CIRCUIT CONFIGURED FOR OUTPUTTING A SELECTED ANALOG VOLTAGE SIGNAL FOR TESTING EXTERNAL TO AN INTEGRATED CIRCUIT

(75) Inventor: Gerald Robert Talbot, Concord, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 11/033,756

(22) Filed: Jan. 13, 2005

(51) Int. Cl.
*G06F 1/08* (2006.01)
(52) U.S. Cl. ........................... 327/99; 327/407
(58) Field of Classification Search ........... 327/99, 327/407
See application file for complete search history.

(56) References Cited

U.S. PATENT DOCUMENTS

| | | | | | |
|---|---|---|---|---|---|
| 4,490,626 | A | * | 12/1984 | Carlson | 327/408 |
| 5,406,132 | A | * | 4/1995 | Housako | 327/172 |
| 5,519,355 | A | * | 5/1996 | Nguyen | 327/565 |
| 5,534,798 | A | * | 7/1996 | Phillips et al. | 326/108 |
| 5,568,070 | A | * | 10/1996 | Osaki et al. | 326/113 |
| 5,646,558 | A | * | 7/1997 | Jamshidi | 326/106 |
| 5,652,527 | A | * | 7/1997 | Phillips et al. | 326/83 |
| 5,671,234 | A | * | 9/1997 | Phillips et al. | 714/726 |
| 5,801,571 | A | * | 9/1998 | Allen et al. | 327/407 |
| 6,040,732 | A | * | 3/2000 | Brokaw | 327/408 |
| 6,194,950 | B1 | * | 2/2001 | Kibar et al. | 327/410 |
| 6,218,887 | B1 | * | 4/2001 | Brown | 327/408 |
| 6,239,646 | B1 | * | 5/2001 | Navabi et al. | 327/407 |
| 6,617,912 | B1 | * | 9/2003 | Bauer | 327/408 |
| 6,633,196 | B2 | * | 10/2003 | Sher | 327/525 |
| 6,768,338 | B1 | * | 7/2004 | Young et al. | 326/44 |
| 6,791,352 | B2 | * | 9/2004 | Verdoorn et al. | 326/38 |
| 6,949,951 | B1 | * | 9/2005 | Young et al. | 326/37 |
| 7,030,679 | B2 | * | 4/2006 | Hopkins | 327/407 |
| 7,046,071 | B1 | * | 5/2006 | Conn et al. | 327/407 |

OTHER PUBLICATIONS

"AMD-3181™ HyperTransport™ PCI-X® Tunnel Data Sheet", 24637 Rev. 3.02, Aug. 10, 2004, pp. 1-87.

* cited by examiner

*Primary Examiner*—Kenneth B. Wells
(74) *Attorney, Agent, or Firm*—Manelli Denison & Selter PLLC; Leon R. Turkevich

(57) ABSTRACT

Access is provided to internal analog voltage signals on internal analog nodes of an integrated circuit, without distortion of the internal analog voltage signals. An integrated circuit includes a voltage access circuit having buffered multiplexer circuits in proximity to respective groups of internal analog nodes for respective internal analog voltage signals. Each voltage access circuit outputs a selected one of the corresponding group of internal analog voltage signals as a buffered analog node signal. The voltage access circuit also includes a buffering output circuit configured for outputting a selected one of the buffered analog node signals from the respective buffered multiplexer circuits, as a buffered voltage signal, to an output pad configured for supplying the buffered voltage signal to an external probe. Successively larger buffer stages minimize loading on the internal analog nodes, while providing sufficient power for outputting the buffered voltage signal to the external probe.

14 Claims, 3 Drawing Sheets

VOLTAGE ACCESS CIRCUIT CONFIGURED FOR OUTPUTTING A SELECTED ANALOG VOLTAGE SIGNAL FOR TESTING EXTERNAL TO AN INTEGRATED CIRCUIT

BACKGROUND OF THE INVENTION

1. Field of the Invention

The present invention relates to analog voltage driver circuits configured for supplying analog voltages within an integrated circuit to an output pad for testing using an external testing device such as a high-speed oscilloscope.

2. Background Art

High-speed input/output (I/O) devices, such as physical layer transceivers (PHYs) or I/O devices, are configured for outputting digital signals on a bus in the form of analog signals having prescribed voltages according to prescribed voltage specifications. Highly integrated mixed signal designs (e.g., integrated bridge devices) for such I/O devices typically have multiple voltage domains and clock domains for both digital and analog circuitry in order to interface between different bus systems, for example a HyperTransport™ link and a PCI-X bus. For example, such I/O devices have relatively complex analog circuitry such as phase locked loops (PLL), etc. Hence, analog operations within the I/O devices need to be precisely controlled.

Process variations that are encountered during manufacture of such high-speed I/O devices into silicon-based integrated circuits often result in integrated circuits that exhibit voltage and/or timing variations due to such process variations, as well as variations caused by temperature changes or variations in supply voltages. Hence, manufacture of such I/O devices as integrated circuits requires testing and evaluation of the integrated circuit to ensure precise control of the analog signals according to the prescribed voltage specifications.

In such highly integrated mixed signal designs, however, it is quite difficult to access internal high-impedance, low capacitance analog nodes for test or debug in a flip-chip assembled die (e.g. a die having conductive bumps on a bond pad). In particular, the physical structure of an assembled die (e.g., a flip-chip assembled die) severely restricts the availability of output pads that can be used for probing internal analog voltages. Moreover, attempts to read an analog voltage signal by digitizing the analog voltage signal into a digital value, and outputting the digital value via a digital output port are not practical due to power consumption, cost of silicon area, and the bandwidth of the analog signal.

Hence, access to a large number of different analog nodes within the integrated circuit is impractical.

SUMMARY OF THE INVENTION

There is a need for an arrangement that enables internal analog voltage signals generated within an integrated circuit to be sampled by an external probe without distortion of the internal analog voltage signals.

These and other needs are attained by the present invention, where access is provided to internal analog voltage signals on internal analog nodes of an integrated circuit, without distortion of the internal analog voltage signals. An integrated circuit includes a voltage access circuit having a plurality of buffered multiplexer circuits in proximity to respective groups of internal analog nodes for respective internal analog voltage signals. Each voltage access circuit outputs a selected one of the corresponding group of internal analog voltage signals as a buffered analog node signal. The voltage access circuit also includes a buffering output circuit configured for outputting a selected one of the buffered analog node signals from the respective buffered multiplexer circuits, as a buffered voltage signal, to an output pad configured for supplying the buffered voltage signal to an external probe. Hence, internal analog voltage signals can be output for testing and measurement; moreover, the voltage access circuit utilizes successively larger buffer stages that minimize loading on the internal analog nodes, while providing sufficient power for outputting the buffered voltage signal to the external probe.

One aspect of the present invention provides an integrated circuit comprising internal analog nodes, a voltage access circuit, and an output pad. The plurality of internal analog nodes are distributed throughout the integrated circuit and configured for providing respective internal analog voltage signals. The voltage access circuit includes a plurality of buffered multiplexer circuits, each positioned in proximity with a corresponding group of the internal analog nodes. Each buffered multiplexer circuit has a buffer amplifier configured for outputting a corresponding selected one of the internal analog voltage signals from the corresponding group of internal analog nodes as a buffered analog node signal. The voltage access circuit also includes a buffering output circuit configured for outputting a selected one of the buffered analog node signals, from the respective buffered multiplexer circuits, as a buffered voltage signal. The output pad is configured for supplying the buffered voltage signal to an external probe. The positioning of buffered multiplexer circuits in proximity with the respective groups of internal analog nodes enables the selection of one of the internal analog voltage signals with minimal capacitive loading on the internal analog nodes. Moreover, the combination of the buffered multiplexer circuit and the buffering output circuit enables the selected internal analog voltage signal to be successively buffered as a buffered voltage signal with sufficient power in order that an external probe can be used to detect the buffered voltage signal.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like element elements throughout and wherein.

BEST MODE FOR CARRYING OUT THE INVENTION

The disclosed embodiment provides access to internal analog voltage signals asserted on internal analog nodes of an integrated circuit, without distortion of the internal analog voltage signals. In particular, the disclosed embodiment includes a voltage access circuit configured for providing access to internal analog voltage signals on respective internal analog nodes.

Figure 1:
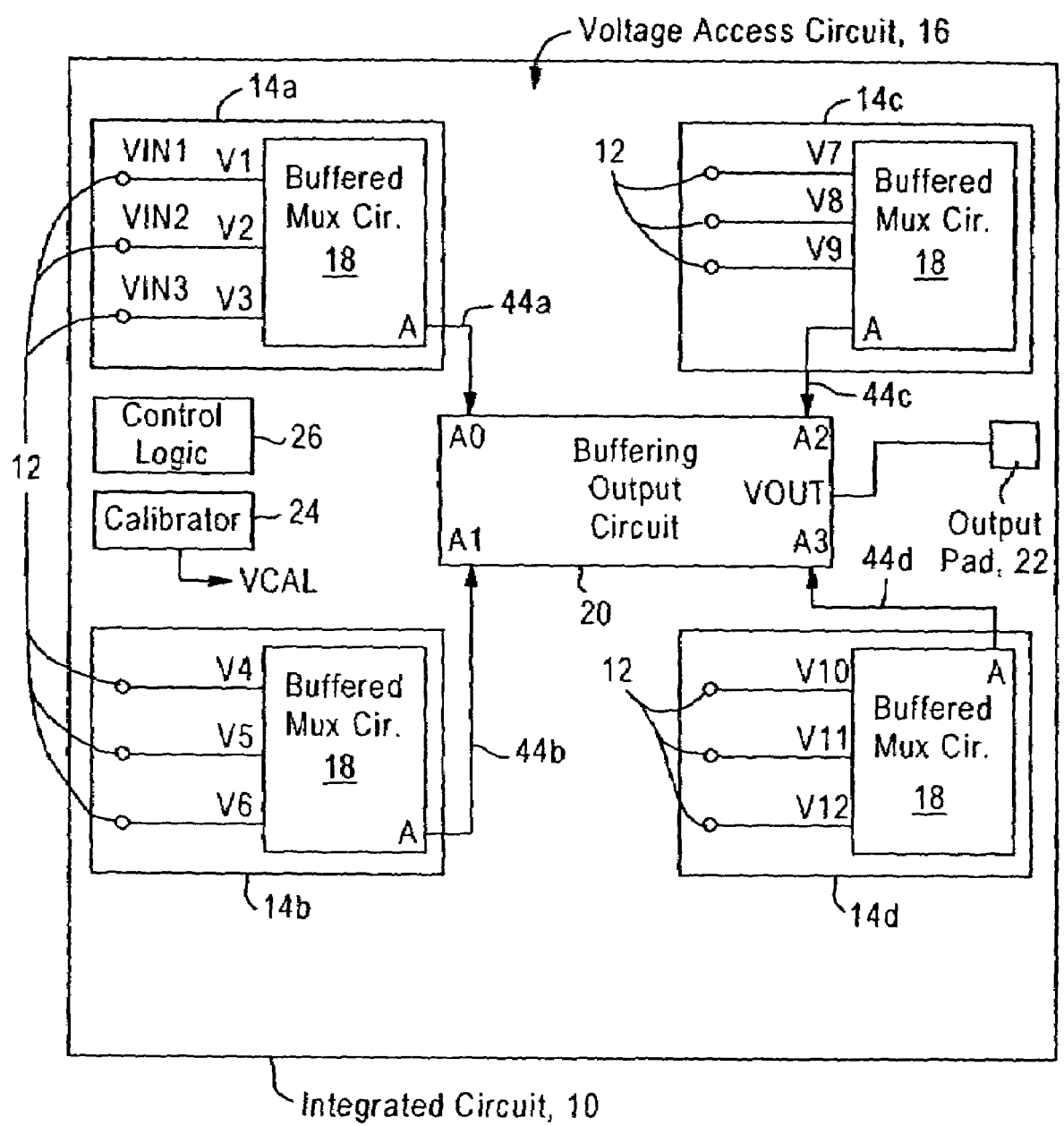
FIG. 1 is a block diagram illustrating an integrated circuit chip having a voltage access circuit configured for outputting a buffered voltage signal derived from an internal analog node, according to an embodiment of the present invention.

FIG. 1 is a diagram illustrating an integrated circuit 10 having internal analog nodes 12 in prescribed regions 14, and a voltage access circuit 16. The voltage access circuit 16 includes a plurality of buffered multiplexer circuits 18, and a buffering output circuit 20 configured for outputting a buffered voltage signal (VOUT), having been obtained from a selected one of the internal analog nodes 12, to an output pad 22 configured for connection with an external signal probe. The output pad may be implemented as a solder ball, a probe pad, or a test pin on the package of the integrated circuit 10 that is accessible by an external signal probe during normal operation of the integrated circuit 10.

As illustrated within FIG. 1, each buffered multiplexer circuit 18 is positioned proximal to a corresponding group of internal analog nodes 12 (e.g., within about 10 microns), such that each buffered multiplexer circuit 18 is within the same area (e.g., 14a) of the corresponding group of internal analog nodes.

Each buffered multiplexer circuit 18 provides negligible load on the corresponding group of connected internal analog nodes 12 (e.g., VIN1, VIN2, VIN3) to prevent distortion of the respective internal analog voltage signals (e.g., V1, V2, V3) that would otherwise affect normal operation.

The voltage access circuit 16 also includes control logic 26 configured for outputting selection signals to each of the buffered multiplexer circuits 18 and the buffering output circuit 20, for outputting one of the internal analog voltage signals (e.g., V11) to the output pad 22, outputting a calibration signal (VCAL) supplied to any one of the buffered multiplexer circuits 18 for calibration of the voltage access circuit 16, or disabling the voltage access circuit 16 during normal operation. The control logic 26 may be implemented as a control register configured for storing the configuration values described herein; in addition, the control register of the control logic 26 may be accessible, for example, using a JTAG scan chain as known in the art.

Hence, during normal operation, the voltage access circuit 16 can be disabled to avoid any power consumption or distortion of the internal analog voltage signals (V1 through V12) on the internal analog nodes 12. When access is needed to measure an internal analog voltage signal (e.g., V1 in region 14a) on an internal analog node (e.g., VIN1 in region 14a) 12, the internal analog node is selected and the corresponding analog voltage signal is buffered to enable the analog voltage signal to be supplied external to the integrated circuit via the output pad 22. Hence, an AC voltage signal can be obtained from an internal analog node (e.g., VIN1 in region 14a) and output via an output pad 22 for analysis using an oscilloscope.

Each buffered multiplexer circuit 18 outputs a buffered analog node signal (A) based on selection of an internal analog voltage signal from a corresponding selected internal analog node. As illustrated in FIG. 1, the disclosed voltage access circuit 16 provides access to twelve (12) unique internal analog voltage signals (V1, V2, ... V12), where any one of the internal analog voltage signals can be output to the output pad 22. In addition, the calibration voltage signal (VCAL) can be output to the output pad 22 after having passed through any one of the buffered multiplexer circuits 18 and the buffering output circuit 20.

Figure 2:
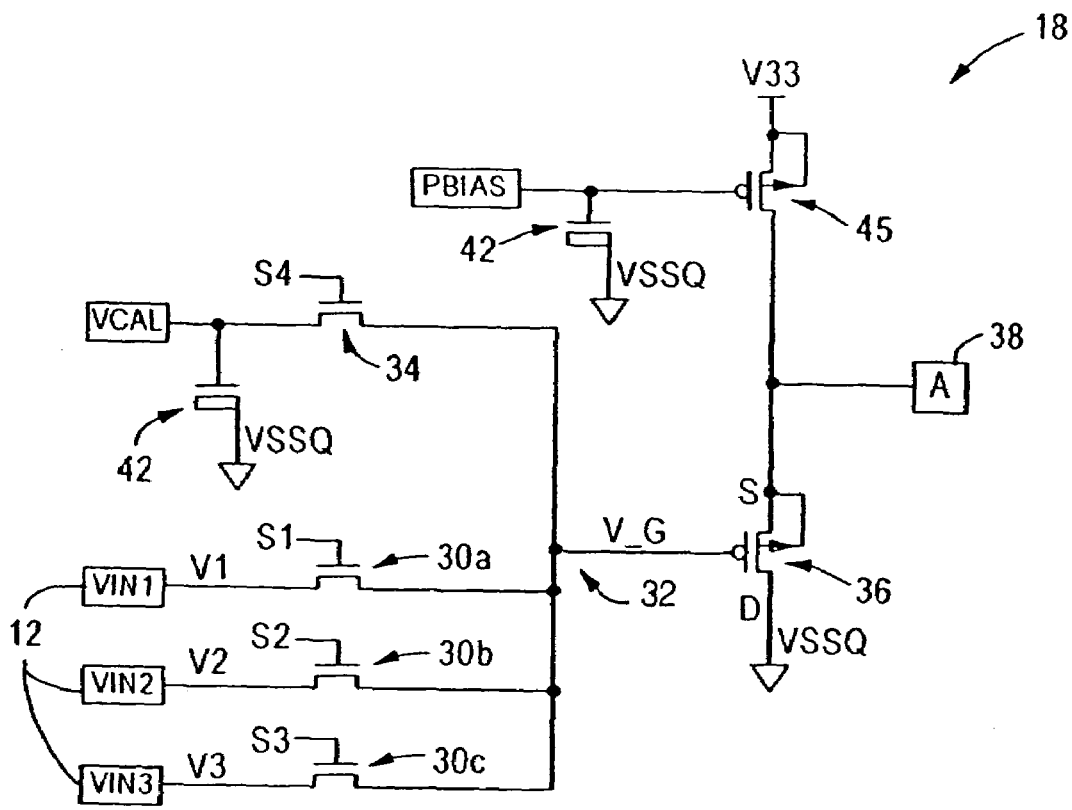
FIG. 2 is a diagram illustrating in detail the buffered multiplexer circuit of FIG. 1, according to an embodiment of the present invention.

FIG. 2 is a diagram illustrating in detail one of the buffered multiplexer circuits 18, according to an embodiment of the present invention. The buffered multiplexer circuit 14 includes a group of switching transistors 30a, 30b, and 30c, each coupled to a multiplexing node 32 and a corresponding internal analog node 12. Each switching transistor 30a, 30b, and 30c is configured for supplying the corresponding internal analog voltage signal (e.g., V1, V2, V3) to the multiplexing node 32 in response to assertion of a corresponding selection signal (S1, S2, S3). The switching transistors (e.g., 30a, 30b, 30c) are thick oxide transistors configured for handling a voltage range of 0V to 1.2 V on the internal analog nodes 12; hence the control logic 26 enables a switching transistor 30 by asserting its corresponding gate input selection signal (e.g., S3) to 3.3V, with minimal capacitive loading on the internal analog node. The buffered multiplexer circuit 14 also includes a buffer amplifier 36, described below.

The buffered multiplexer circuit 14 also includes a calibration switching transistor 34 configured for outputting a calibration signal (VCAL) to the multiplexing node 32 in response to a corresponding selection signal (S4). The selection signals (S1, S2, S3, and S4) are mutually exclusive binary selection signals, such that only one selection signal (e.g., S1) per buffered multiplexer circuit 18 is asserted at any time by the control logic 26, such that the buffered multiplexer circuit 18 acts as a four-to-one (4:1) multiplexer that outputs only one of the four supplied inputs.

As described below with respect to FIG. 3, the calibration signal (VCAL) is used to calibrate the gain and offset of the buffer amplifier 36, implemented as a P-FET source follower, and subsequent source followers coupled in between the buffer amplifier 36 and the output pad 22. The buffer amplifier 36 has its drain coupled to a base reference voltage (VSS=ground), and its source coupled to the output node 38. The selected signal on the multiplexing node 32 is supplied as a gate signal (V_G) to the buffer amplifier, causing the buffer amplifier 36 to buffer the gate signal (V_G) and output the buffered analog node signal (A). Hence, the buffer amplifier 36 source-follows the gate input signal (V_G) by outputting the buffered analog node signal (A), the buffer amplifier 36 having a voltage gain of less than 1 (typically a gain within the range of about 0.85 to 0.9).

The use of a source follower as the buffer amplifier 36 causes a DC offset to be added to the buffered analog node signal (A) relative to the gate signal (V_G), as well as a slight change in signal strength due to non-unitary voltage gain (i.e., gain does not equal one). Hence, the amplifier 36 needs to be calibrated to adjust for the DC offset and signal gain caused by the amplifier 36.

Figure 3:
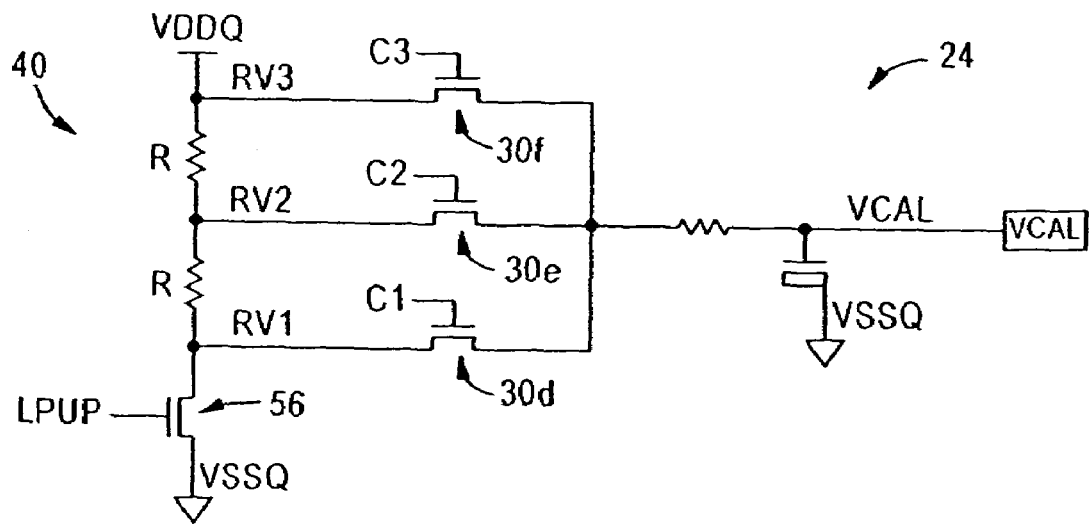
FIG. 3 is a diagram illustrating in detail the calibration circuit of FIG. 1.

FIG. 3 is a diagram illustrating the calibration reference voltage generator 24, according to an embodiment of the present invention. The calibration reference voltage generator 24 is configured for generating a precision voltage reference (VCAL), also referred to as a calibration signal, that is supplied to each calibration switching transistor 34 of each buffered multiplexer circuit 18. The calibration reference voltage generator 24 includes a potential divider 40, and selection transistors 30d, 30e, and 30f. The potential divider 40 is coupled to selection transistors 30d, 30e, and 30f and is configured for supplying one of the reference voltages RV1, RV2, or RV3 for external measurement on the output pad 22 in response to assertion of one of the corresponding selection signals C1, C2, and C3 from the control logic 26.

Since the resistors R of the voltage divider 40 are of equal value and the base reference VSS is coupled to ground, the control logic 26 can assert one of the selection signals C1, C2, or C3 to cause the voltage of VCAL to be zero volts (RV1=VSS), one-half the supply voltage (RV2=VDD/2), or the supply voltage (RV3=VDD). By being able to measure these voltages through the amplifier 36 at the output pin, the gain and offset for the amplifier 36 and subsequent source followers in the buffering output circuit 20 can be compensated.

Referring to FIG. 2, the buffered multiplexer circuit 18 also includes decoupling MOSFET capacitors 42 to eliminate noise, and a bias transistor 45. The bias transistor 42 is configured for supplying a bias current for the amplifier 36 in response to a bias signal PBIAS from the control logic 26. Hence, the bias signal PBIAS is a load for the source follower 36: during normal operation the control logic 26 disables the PBIAS signal to prevent any DC current from flowing through the buffer amplifier 36.

Hence, if the gate signal is asserted (V_G=1.2V), and for the current flowing from the bias transistor 45 the amplifier 36 required a gate-source voltage of 0.4V (V_GS=0.4V), then the buffered analog node signal (A) would be at 1.6V (A=1.6V). If the gate signal is at zero volts (V_G=0V), the source will also be approximately 0.5V higher, such that the buffered analog node signal (A) would be at 0.5V (A=0.5V).

Hence, the calibration circuit 24 enables calibration since the voltage swing of the buffered analog node signal (0.5V<A<1.6V) will be smaller than the voltage swing on the internal analog voltage signal (e.g., 0.0V≦VIN1≦1.2V).

As described above, the transistors 30a, 30b, 30c for each buffered multiplexer circuit are positioned proximal to (i.e., in proximity to) the internal analog nodes 12 being probed. In addition, the transistors 30a, 30b, and 30c are implemented using small device size transistors, in order to present a minimum load to the analog voltages VIN1, VIN2, and VIN3.

Figure 4:
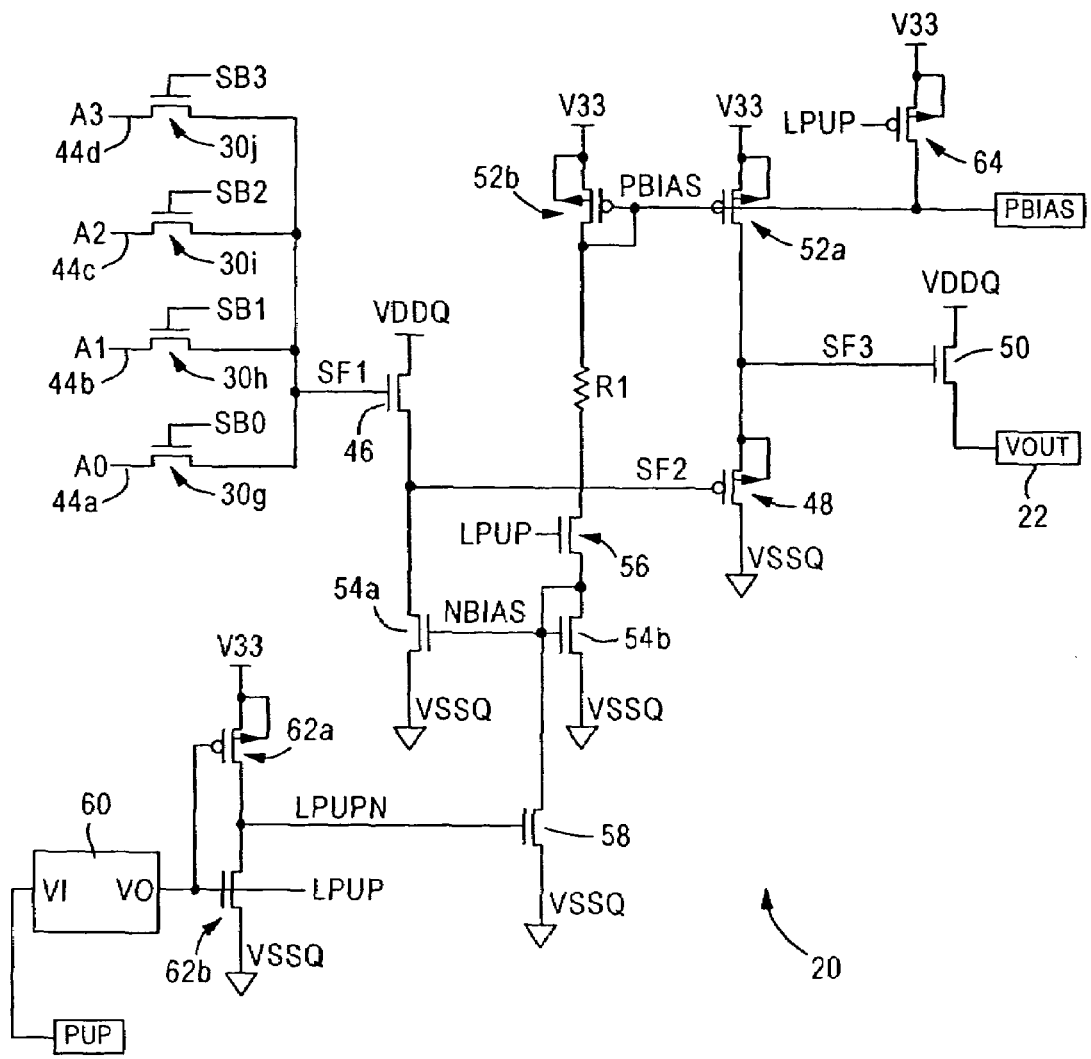
FIG. 4 is a diagram illustrating in detail the buffering output circuit of FIG. 1, according to an embodiment of the present invention.

FIG. 4 is a diagram illustrating the buffering output circuit 20, according to an embodiment of the present invention. The buffering output circuit 20 is configured for receiving the buffered analog node signals (A0, A1, A2, and A3) from the buffered multiplexers 18 of the respective regions 14a, 14b, 14c, and 14d via respective paths 44a, 44b, 44c, and 44d. The buffering output circuit 20 includes a 4:1 multiplexer, as described above with respect to FIG. 2, using selection transistors 30g, 30h, 30i, and 30j configured for selecting among the buffered analog node signals (e.g., A0) from paths 44a, 44b, 44c, and 44d in response to assertion of a corresponding one of the respective gate selection signals SB0, SB1, SB2, and SB3 by the control logic 26. Hence, the two stage multiplexers between the circuits 18 and 20 enables selection from among twelve (12) analog voltage signals (V1 through V12) or the calibration signal (VCAL) supplied to any one of the buffered multiplexer circuits 18.

The selected buffered output signal (e.g., SF1=A0), also referred to as a source-followed signal, is output to an N-channel source follower circuit 46, resulting in the source-followed signal SF2. The N-channel source follower circuit 46 (having an N-channel type) is complementary to the P-channel source follower 36 of FIG. 2 (N-channel versus P-channel), also described herein as having a complementary channel type. Hence, the upward voltage shift in the output signal A (shown in FIG. 4 as SF1) caused by the gate-source voltage of 0.5V (V_GS=0.5V) in the P-channel source follower 36 is substantially canceled out by the downward voltage shift in the shifted output signal SF2 caused by the gate-source voltage of 0.5V (V_GS=0.5V) in the N-channel source follower transistor 46.

Similarly, the buffered output circuit 20 includes a P-channel source follower 48 (having a P-channel type) configured for output a shifted source-followed signal SF3 based on the gate-source voltage of 0.5V (V_GS=0.5V) in the P-channel source follower transistor 48. The upward voltage shift in the shifted output signal SF3 caused by the gate-source voltage of 0.5V (V_GS=0.5V) in the P-channel source follower 48 is canceled out by the downward voltage shift in the buffered output signal VOUT caused by the gate-source voltage of 0.5V (V_GS=0.5V) in the N-channel source follower transistor 50, also referred to as an output transistor.

Hence, the use of complementary source follower transistors 36, 46, 48, and 50 in sequence minimizes the DC offset that may otherwise accumulate between the original internal analog voltage signals (e.g., V1) being selected and the buffered output signal (VOUT). In addition, each stage of source follower transistors 36, 46, 48, and 50 has a corresponding size increase (e.g., about a 5:1 increase in device size), providing a corresponding 5:1 gain in power due to a corresponding increase in current, enabling a successively larger capacitive load to be driven, until reaching the output transistor 50 which is sufficiently large (e.g., about 500 microns of channel width) to drive a 50 ohm oscilloscope probe. Exemplary sizes for the channel widths of the source follower transistors 36, 46, 48, and 50 are 0.8 microns, 4 microns, 20 microns, 100 microns, and 500 microns, respectively.

The buffered output circuit 20 also includes bias transistors configured for providing bias voltages for the source follower transistors 46, 48, and 50. In particular, the buffered output circuit 20 includes bias transistors 52a and 52b configured for supplying a bias current in response to the bias signal (PBIAS) from the control logic 26, and bias transistors 54a and 54b configured for supplying a bias current in response to the bias signal. In addition, the bias transistors 45, 54a, and 52a for the respective stages are scaled to provide a corresponding 5:1 increase in bias current.

The transistor 52b is a P-channel current mirror, where its gate is connected to its drain. The drain of transistor 52b is coupled in series with a resistor R1, which is coupled to an enabling transistor 56 used for enabling the circuit 20 in response to a powerup signal (LPUP). The transistor 54b is an N-channel current mirror having its gate and drain connected to the bias signal NBIAS. The disabling transistor 58 is turned off when the powerdown signal (LPUPN) is turned off (i.e., LPUP and LPUPN are logical inverses of each other). In particular, a power up signal (PUP) (e.g., from the control logic 26) having a 1.2V swing voltage is supplied to a level shifter 60, configured for level shifting a 1.2V signal to 3.3V; the level shifter 60 outputs the powerup signal (LPUP), and the CMOS inverter 62 composed of transistors 62a and 62b output the powerdown signal (LPUPN) to the disabling transistor 58. A diabling transistor 64 also couples the PBIAS input to its corresponding voltage supply rail (V33=3.3V) in response to the powerup signal (LPUP) being deasserted in a power-down condition, ensuring the transistors 52a and 52b draw no current when the circuit is not being used to monitor internal voltages.

Hence, in response to the powerup signal LPUP being turned on (and LPUPN being turned off), the disabling transistor 58 is turned off and the disabling transistor 64 is turned off. Hence, a current flow through the resistor R1 connects the diodes 52b and 54b, establishing the current for NBIAS and PBIAS. Hence, the bias transistor 54a controls the bias for the source follower 46, and the bias transistor 52a controls the bias for the source follower 48.

Hence, the disclosed embodiment can output a buffered voltage signal (VOUT) that represents a buffered version of the original AC analog signal (e.g., V1) from an internal analog node 12. The bandwidth of the voltage access circuit 16, including the buffered multiplexer circuits 18 and the buffering output circuit 20, exceeds 600 MHz, enabling high-speed AC analog signals at an internal voltage node 12 to be analyzed at the output pad 22 using a 50 ohm transmission line to a 50 ohm-terminated input on a high-speed oscilloscope.

According to the disclosed embodiment, a voltage access circuit having a buffering multiplexer circuit and a buffering output circuit is implemented on an integrated circuit for monitoring of analog voltage nodes within an integrated circuit design. The load impedance of the probe connection on an output pad is minimized by implementing a multi-stage design, and distributing the multiplexer circuits across the integrated circuit die to ensure physical proximity to the circuits to be probed, minimizing capacitive loading.

A cascaded sequence of complementary source following buffers achieve a sufficient power gain to drive an external 50 ohm load for direct connection to a high bandwidth oscilloscope. In addition, any voltage gain loss of the source follower circuitry can be calibrated using a three-level measurement of a test voltage at the input stage of the probe circuit. The voltage access circuit is disabled during normal operation, ensuring negligible load on the internal nodes being monitored. Thick oxide transistors and a 3.3V supply are used in the design of the buffered multiplexer circuit 14 and the buffering output circuit 20 to ensure that the full voltage swing of the 1.2V analog voltage signals can be monitored externally. The disclosed embodiment enables analog signals with bandwidths exceeding 500 MHz to be output for external probing of an integrated circuit packaged using a flip-chip design.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. An integrated circuit comprising:
a plurality of internal analog nodes distributed throughout the integrated circuit and configured for providing respective internal analog voltage signals;
a voltage access circuit comprising:
(1) a plurality of buffered multiplexer circuits, each positioned in proximity with a corresponding group of the internal analog nodes, each buffered multiplexer circuit having a primary buffer amplifier configured for outputting a corresponding selected one of the internal analog voltage signals from the corresponding group of internal analog nodes as a buffered analog node voltage signal, and
(2) a buffering output circuit configured for outputting a selected one of the buffered analog node voltage signals, from the respective buffered multiplexer circuits, as a buffered analog voltage signal; and an output pad configured for supplying the buffered analog voltage signal to an external probe.

2. The integrated circuit of claim 1, wherein the buffering output circuit includes a plurality of cascaded secondary buffer amplifiers configured for successively increasing a current for the selected one of the buffered analog node voltage signals, the primary buffer amplifier of each corresponding buffered multiplexer circuit and each of the cascaded secondary buffer amplifiers configured as a source-follower transistor circuit.

3. The integrated circuit of claim 2, wherein:
each of the primary buffer amplifiers has a first channel type,
the cascaded secondary buffer amplifiers are composed of a second buffer amplifier, a third buffer amplifier, and a fourth buffer amplifier, the second buffer amplifier having a second channel type complementary to the first channel type and being configured for receiving the selected one of the buffered analog node voltage signals as a first source-followed signal and outputting a second source-followed signal,
the third buffer amplifier having the first channel type and being configured for receiving the second source-followed signal and outputting a third source-followed signal,
the fourth buffer amplifier having the second channel type and being configured for receiving the third source-followed signal and outputting a fourth source-followed signal as the buffered analog voltage signal.

4. The integrated circuit of claim 3, wherein the second buffer amplifier, the third buffer amplifier, and the fourth buffer amplifier are configured for compensating for a corresponding voltage shift in each of the first source-followed signal, the second source-followed signal, and the third source-followed signal, respectively.

5. The integrated circuit of claim 4, wherein:
each buffered multiplexer circuit includes a first bias circuit configured for controlling a bias current for the corresponding primary buffer amplifier in response to a bias signal,
the buffering output circuit further includes a second bias circuit configured for controlling the current bias for the second buffer amplifier and the third buffer amplifier in response to the bias signal.

6. The integrated circuit of claim 4, wherein:
each of the buffered multiplexer circuits include a plurality of first MOSFET transistors having first ends coupled to the respective internal analog nodes of the corresponding group and second ends coupled to a gate of the corresponding primary buffer amplifier, each MOSFET transistor controlled by a corresponding first selection signal input controlled by control logic;
the buffering output circuit includes a plurality of second MOSFET transistors having third ends coupled for reception of the respective buffered analog node voltage signals and fourth ends coupled to a gate of the second buffer amplifier, each second MOSFET transistor controlled by a corresponding second selection signal input controlled by the control logic,
wherein the control logic controls the first and second selection signal inputs for the first and second MOSFET transistors for selection of a single one of the inputs to the first MOSFET transistors for output to the second buffer amplifier.

7. The integrated circuit of claim 6, further comprising a calibrator circuit having a potential divider circuit and a plurality of third MOSFET transistors configured for outputting one of a corresponding plurality of reference voltages in response to a third selection signal input, wherein:
each of the buffered multiplexer circuits include a calibration MOSFET transistor having a first end coupled to receive the one reference voltage and a second end coupled to the gate of the corresponding primary buffer amplifier, each MOSFET transistor controlled by a corresponding calibration selection signal input controlled by the control logic, wherein the control logic selects between one of the first selection signal inputs and the calibration selection signal input for outputting the one reference voltage by the corresponding primary buffer amplifier.

8. A method in an integrated circuit, the method comprising:
providing a plurality of internal analog nodes distributed throughout the integrated circuit and configured for providing respective internal analog voltage signals;
providing a voltage access circuit comprising (1) a plurality of buffered multiplexer circuits, each positioned in proximity with a corresponding group of the internal analog nodes, each buffered multiplexer circuit having a primary buffer amplifier configured for outputting a corresponding selected one of the internal analog voltage signals from the corresponding group of internal analog nodes as a buffered analog node voltage signal, and (2) a buffering output circuit configured for outputting a selected one of the buffered analog node voltage signals, from the respective buffered multiplexer circuits, as a buffered analog voltage signal; and
selecting one of the internal analog voltage signals for buffering and outputting, as the buffered analog voltage signal, to an output pad configured for supplying the buffered analog voltage signal to an external probe.

9. The method of claim 8, wherein the providing step includes successively increasing a current for the selected one of the buffered analog node voltage signals using a plurality of cascaded secondary buffer amplifiers, the primary buffer amplifier of each corresponding buffered multiplexer circuit and each of the cascaded secondary buffer amplifiers configured as a source-follower transistor circuit.

10. The method of claim 9, wherein:
each of the primary buffer amplifiers has a first channel type,
the cascaded secondary buffer amplifiers are composed of a second buffer amplifier, a third buffer amplifier, and a fourth buffer amplifier, the second buffer amplifier having a second channel type complementary to the first channel type and being configured for receiving the selected one of the buffered analog node voltage signals as a first source-followed signal and outputting a second source-followed signal,
the third buffer amplifier having the first channel type and being configured for receiving the second source-followed signal and outputting a third source-followed signal,
the fourth buffer amplifier having the second channel type and being configured for receiving the third source-followed signal and outputting a fourth source-followed signal as the buffered analog voltage signal.

11. The method of claim 10, wherein the providing further includes compensating for a voltage shift in each of the first source-followed signal, the second source-followed signal, and the third source-followed signal by the second buffer amplifier, the third buffer amplifier, and the fourth buffer amplifier, respectively.

12. The method of claim 11, wherein the providing further includes:
providing in each buffered multiplexer circuit a first bias circuit configured for controlling a bias current for the corresponding primary buffer amplifier in response to a bias signal,
providing in the buffering output circuit a second bias circuit configured for controlling the current bias for the second buffer amplifier and the third buffer amplifier in response to the bias signal.

13. The method of claim 11, wherein:
each of the buffered multiplexer circuits include a plurality of first MOSFET transistors having first ends coupled to the respective internal analog nodes of the corresponding group and second ends coupled to a gate of the corresponding primary buffer amplifier, each MOSFET transistor controlled by a corresponding first selection signal input controlled by control logic;
the buffering output circuit includes a plurality of second MOSFET transistors having third ends coupled for reception of the respective buffered analog node voltage signals and fourth ends coupled to a gate of the second buffer amplifier, each second MOSFET transistor controlled by a corresponding second selection signal input controlled by the control logic,
the selecting including supplying an instruction to the control logic to control the first and second selection signal inputs for the first and second MOSFET transistors, for selection of a single one of the inputs to the first MOSFET transistors for output to the second buffer amplifier.

14. The method of claim 13, wherein the providing further includes:
providing a calibrator circuit having a potential divider circuit and a plurality of third MOSFET transistors configured for outputting one of a corresponding plurality of reference voltages in response to a third selection signal input:
providing each of the buffered multiplexer circuits with a calibration MOSFET transistor having a first end coupled to receive the one reference voltage and a second end coupled to the gate of the corresponding primary buffer amplifier, each MOSFET transistor controlled by a corresponding calibration selection signal input controlled by the control logic,
the selecting including specifying within the instruction an instruction for selecting between one of the first selection signal inputs and the calibration selection signal input for outputting the one reference voltage by the corresponding primary buffer amplifier.

* * * * *